US010937665B2

(12) United States Patent
Lilak et al.

(10) Patent No.: US 10,937,665 B2
(45) Date of Patent: Mar. 2, 2021

(54) METHODS AND APPARATUS FOR GETTERING IMPURITIES IN SEMICONDUCTORS

(71) Applicant: Intel Corporation, Santa Clara, CA (US)

(72) Inventors: Aaron D. Lilak, Beaverton, OR (US); Harold W. Kennel, Portland, OR (US); Patrick Morrow, Portland, OR (US); Rishabh Mehandru, Beaverton, OR (US); Stephen M. Cea, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/327,713

(22) PCT Filed: Sep. 30, 2016

(86) PCT No.: PCT/US2016/054855
§ 371 (c)(1),
(2) Date: Feb. 22, 2019

(87) PCT Pub. No.: WO2018/063350
PCT Pub. Date: Apr. 5, 2018

(65) Prior Publication Data
US 2019/0189464 A1 Jun. 20, 2019

(51) Int. Cl.
*H01L 21/322* (2006.01)
*H01L 21/265* (2006.01)
*H01L 21/768* (2006.01)
*H01L 21/38* (2006.01)
(Continued)

(52) U.S. Cl.
CPC .... *H01L 21/3226* (2013.01); *H01L 21/26506* (2013.01); *H01L 21/3221* (2013.01); *H01L 21/38* (2013.01); *H01L 21/70* (2013.01); *H01L 21/768* (2013.01); *H01L 23/26* (2013.01)

(58) Field of Classification Search
CPC . H01L 21/3226; H01L 21/38; H01L 21/3221; H01L 21/70; H01L 21/768; H01L 21/26506; H01L 23/26
See application file for complete search history.

(56) References Cited

U.S. PATENT DOCUMENTS 3,783,119 A * 1/1974 Gregor .................... H01L 21/00
204/192.25
3,997,368 A * 12/1976 Petroff ................ H01L 21/0217
438/476

(Continued)

OTHER PUBLICATIONS

Patent Cooperation Treaty, "International Search Report," issued in connection with International Application No. PCT/US2016/054855, dated Jun. 27, 2017, 4 pages.

(Continued)

*Primary Examiner* — Sitaramarao S Yechuri
(74) *Attorney, Agent, or Firm* — Green, Howard & Mughal LLP (57) ABSTRACT

Methods and apparatus for gettering impurities in semiconductors are disclosed. A disclosed example multilayered die includes a substrate material, a component layer below the substrate material, and an impurity attractant region disposed in the substrate material.

15 Claims, 7 Drawing Sheets

(51) Int. Cl.
*H01L 21/70* (2006.01)
*H01L 23/26* (2006.01)

(56) References Cited

U.S. PATENT DOCUMENTS

| | | | | |
|---|---|---|---|---|
| 4,249,962 A | * | 2/1981 | Celler | H01L 21/268 |
| | | | | 438/462 |
| 5,223,734 A | * | 6/1993 | Lowrey | H01L 21/3221 |
| | | | | 257/350 |
| 5,734,195 A | * | 3/1998 | Takizawa | H01L 21/26506 |
| | | | | 257/607 |
| 5,976,900 A | | 11/1999 | Qiao et al. | |
| 5,976,956 A | * | 11/1999 | Gardner | H01L 21/26506 |
| | | | | 438/473 |
| 6,479,875 B1 | | 11/2002 | Gonzalez | |
| 2003/0141547 A1 | * | 7/2003 | Yamashita | H01L 21/76264 |
| | | | | 257/350 |
| 2005/0170573 A1 | | 8/2005 | Makita et al. | |
| 2010/0084686 A1 | * | 4/2010 | Cai | H01L 21/823425 |
| | | | | 257/192 |
| 2011/0114168 A1 | * | 5/2011 | Habermann | H01L 21/2255 |
| | | | | 136/256 |
| 2013/0048882 A1 | | 2/2013 | Yoshitake et al. | |
| 2015/0123221 A1 | * | 5/2015 | Reinmuth | B81C 1/00285 |
| | | | | 257/417 |
| 2016/0163721 A1 | * | 6/2016 | Yao | H01L 27/11521 |
| | | | | 257/321 |

OTHER PUBLICATIONS

Patent Cooperation Treaty, "Written Opinion of the International Searching Authority," issued in connection with International Application No. PCT/US2016/054855, dated Jun. 27, 2017, 9 pages.

\* cited by examiner

METHODS AND APPARATUS FOR GETTERING IMPURITIES IN SEMICONDUCTORS

FIELD OF THE DISCLOSURE

This disclosure relates generally to semiconductor fabrication, and, more particularly, to methods and apparatus for gettering impurities in semiconductors.

BACKGROUND

In recent years, semiconductor devices such as microprocessors (e.g., processors) have become smaller and more compact while their die transistor counts have increased dramatically due to increasing computational needs (e.g., transistor counts in the billions). The increased transistor densities have also resulted in greater transistor interconnect complexities as well as an increase in the number of interconnects between transistors. As a result, spacing (e.g., free space/volume) in the semiconductor devices has been greatly reduced. Further, semiconductor layers are increasingly being stacked vertically due to increased transistor density, which can necessitate vertical metal routing through semiconductor layers.

As a result of decreased spacing between transistors and/or transistor interconnects associated with the increasing transistor densities as well as the introduction of metal routing through the semiconductor substrate, fabrication of semiconductor devices may result in a presence of impurities (e.g., metal impurities) that can cause unintended shorting, which may damage and/or render inoperable a semiconductor device. Thus, these increased transistor densities may also result in lower overall yields and/or latent failures that may manifest during operation (e.g., during use). For example, metal impurities that result from routing metal within a via through a relatively thin semiconductor layer to couple to metal routing placed on a backside of an initial die or to a second semiconductor layer following a back side reveal (e.g., an etching process) of a wafer die may migrate, diffuse and/or be deposited onto metal interconnects and/or components (e.g., transistors), thereby causing potentially damaging shorting.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Methods and apparatus for gettering impurities in semiconductors are disclosed. In recent years, semiconductor devices such as microprocessors (e.g., processors, central processing units (CPUs), etc.) have become smaller and more compact while their die transistor counts have increased dramatically due to increasing computational needs (e.g., transistor counts in the billions). This resultant increase in transistor densities of the semiconductor devices has led to decreased spacing therebetween which, in turn, has also caused an increased a risk of impurities and/or other potentially damaging materials, such as byproducts from semiconductor fabrication (e.g., during a back side reveal and/or routing metal through the semiconductor region vertically) that can impact operation of the semiconductor devices and/or overall yields. In particular, the impurities may be atoms and/or molecules (e.g., metallic molecules, metals) and/or other compounds that can coupled (e.g., bind) to interconnects and/or openings in a substrate material, thereby causing electrical shorts or other unintended operation, which can result in defects as well as lower overall yields of semiconductors of a wafer.

The examples disclosed herein efficiently reduce a probability of impurities (e.g., metal impurities) from impacting functionality and/or yields of semiconductor devices by substantially removing a presence of free metal impurities, for example, which may result from semiconductor fabrication. In particular, the examples disclosed herein effectively remove these impurities from a semiconductor substrate by attracting/moving the impurities to designated portions of the semiconductor device and/or the semiconductor substrate so that other portions (e.g., functional portions, electrical portions, etc.) are not adversely affected. In particular, the examples disclosed herein define and/or create areas and/or volumes of a substrate (e.g., an interlayer dielectric) with a material (e.g., a molecular composition) and/or a geometry (e.g., a molecular geometry) that attract and/or retain impurities such that the impurities do not affect semiconductor operation.

To define an impurity attractant region (e.g., a surface, a volume, a portion, etc.) that binds and/or attracts impurities during a metallization or back side reveal process, for example, the examples disclosed herein include an area and/or volume of a substrate to which impurities are attracted. In some examples, gettering material is applied to a substrate to define the impurity attractant region. In some other examples, a damage region is used to define the impurity attractant region. In some examples, a resist layer and/or a resist pattern is used to define this region. In some examples, a surface of the substrate is etched so that a gettering material can be applied. In some other examples, a damage region of the substrate is defined during an ion implantation process to define the region, for example. In particular, the damage region defines exposed molecular lattice structures that attract impurities.

As used herein, the terms "impurity attractant" and "impurity attracting region" encompass an applied gettering material as well as a damage region volume, which may be defined by ion implantation or high Phosphorous doping. As used herein, the term "damage region" may refer to a volume or area/surface in which a crystalline structure is exposed (e.g., via an opening) to expose lattice structure(s) of molecules. As used herein, the terms "patterning" or "pattern" may refer to applying/depositing a layer and/or substrate of at least one material in a defined pattern (e.g., a pattern as opposed to a completely filled in layer).

Figures 1A, 1B:
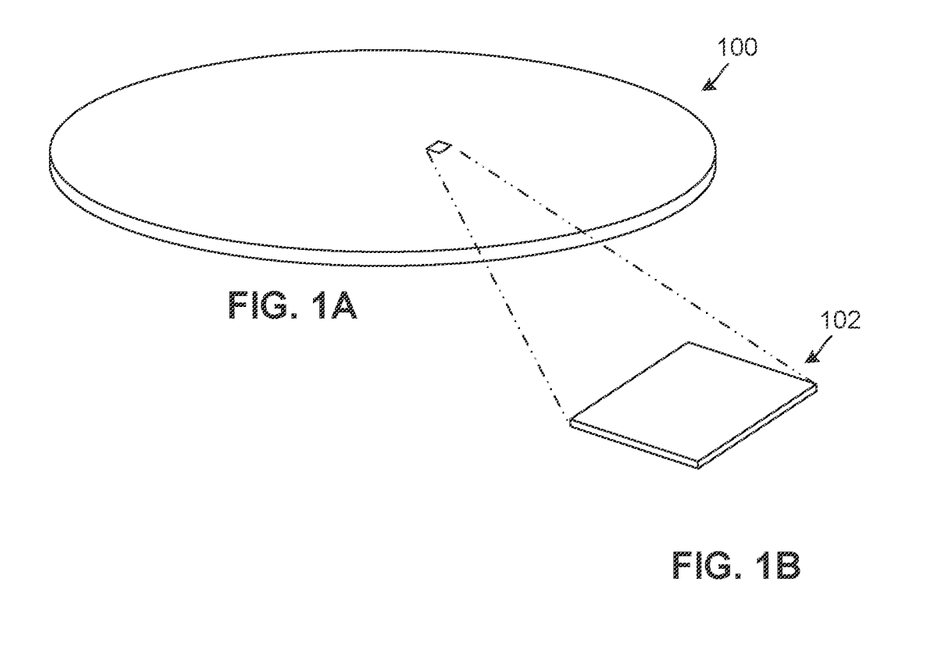
FIG. 1A illustrates an example wafer in which the examples disclosed herein may be implemented.
FIG. 1B illustrates an example die that may be cut from the wafer of FIG. 1A.

FIG. 1A illustrates an example wafer 100 in which the examples disclosed herein may be implemented. The wafer 100 of the illustrated example consists of multiple semiconductor dies. In this example, the individual semiconductor dies are functionally tested prior to being separated (e.g., cut) from the wafer 100. In particular, test patterns are provided to each individual die and each individual die is monitored to have a designated response. In some examples, faulty dies discovered during this testing are discarded.

FIG. 1B illustrates an example die (e.g., a microprocessor die) 102 that may be cut from the wafer 100 of FIG. 1A. In this example, the die 102 is cut from the wafer 100 and separated (e.g., cut and/or sliced) from the wafer 100 after being successfully tested with the aforementioned functionality test described above. The die 102 of the illustrated example may be used for a microprocessor or any other semiconductor device, for example.

Figure 2:
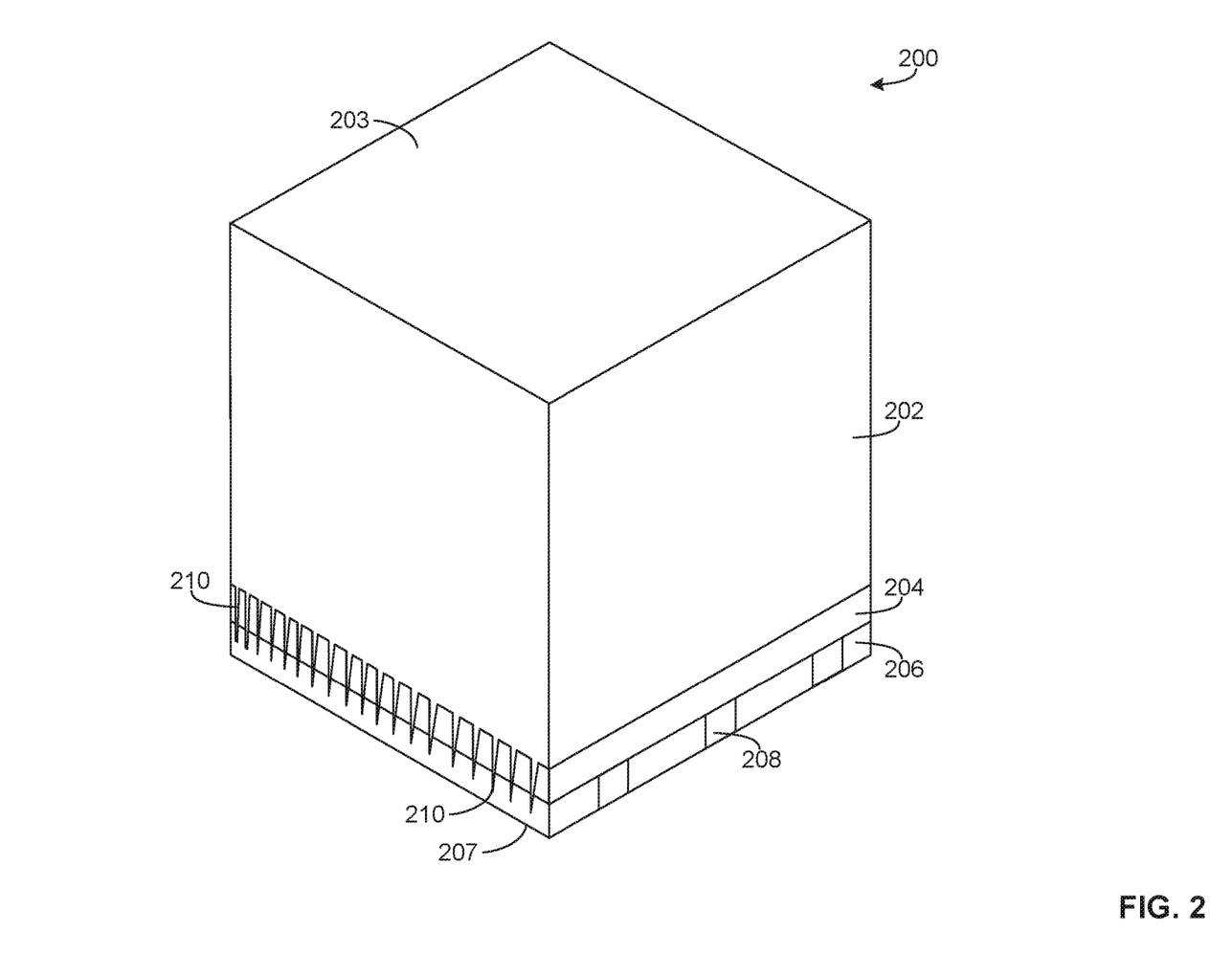
FIG. 2 is a detailed cross-sectional view of an example layered structure of the example wafer of FIG. 1A, in which the examples disclosed herein may be implemented.

FIG. 2 is a detailed cross-sectional view of a layered structure (e.g., a layered die structure, a layered wafer structure, etc.) 200 of the example wafer 100 of FIG. 1A. The example layered structure 200 includes a first substrate (e.g., a first dielectric substrate) 202, which defines a back side 203 of the layered structure 200, a second substrate (e.g., a second dielectric substrate) 204, a component layer 206, which defines a front side 207 of the layered structure 200, and components (e.g., transistors portions, gates) 208. In the view of FIG. 2, the substrate 202 extends to the component layer (e.g., a component layer interlayer dielectric, a component dielectric substrate, etc.) 206 with protrusions/fins 210. For clarity, interconnects (e.g., metal interconnects) are not shown in the illustrated example of FIG. 2. Additionally or alternatively, components may extend from the front side 207. In some examples, the substrate 202 ranges from 10 nanometers (nm) to 500 nm.

In some examples, components may extend into or out of the first substrate 202, the second substrate 204 and/or the component layer 206. In some examples, the substrate 202 may be thinned via a mechanical, photochemical and/or chemical etching process(es) during a back side reveal process, for example. In some examples, there may be metal contacts and/or interconnects on or within the example first substrate 202 and/or the example second substrate 204. In some examples the first substrate 202, the second substrate 204 and/or the component layer 206 may be composed of identical materials. In some examples, the substrate 202, the second substrate 204 and/or the component layer 206 are composed of Silicon.

Figure 3A:
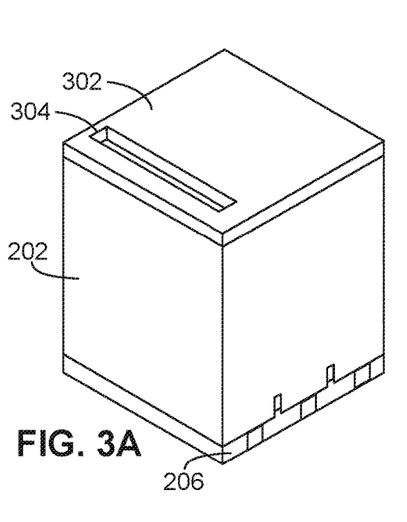
FIGS. 3A-3E are cross-sectional views of the example layered structure of FIG. 2, illustrating fabrication of a semiconductor using an example method in accordance with the teachings of this disclosure.

FIGS. 3A-3E are cross-sectional views illustrating fabrication of a semiconductor using an example method in accordance with the teachings of this disclosure. Turning to FIG. 3A, the example layered structure 200 of FIG. 2, which is rotated from the view shown in FIG. 2, has been applied with (e.g., layered with) a resist layer 302, which may be applied and/or deposited via a photo-resist process or an etch-resist process. In this example, the resist layer 302, which has been applied to the substrate 202 and/or an exposed surface of the substrate 202, includes an opening 304. In particular, the example opening 304 is defined when the resist layer 302 is patterned to the substrate 202 via a lithography process that defines a pattern with multiple openings/voids, in this example. In some examples, the layered structure 200 is held in place by and/or coupled to a fixture during patterning/application of the resist layer 302 (or any of the example steps described below).

The resist layer 302 may consist of Polymethyl Methacrylate (PMMA), AZ 111 photoresist, or any appropriate resist layer. The resist layer 302 of the illustrated example is applied at a thickness between 10 nm to 100 nm.

Figure 3B:
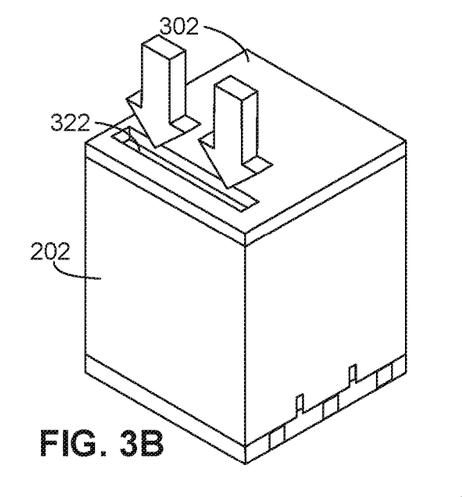

FIG. 3B depicts an etching process of the example layered structure 200. In particular, an exposed surface 322 in the opening 304 of the illustrated example is etched via a photochemical, chemical, photochemical and/or mechanical etching process. In particular, placement and dimensions of the opening 304 enable the exposed surface 322 to be etched at specified areas of the substrate 202.

Figure 3C:
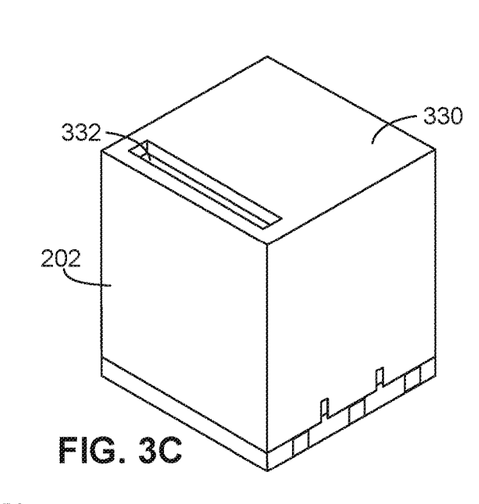

Turning to FIG. 3C, after the etching process of FIG. 3B, the resist layer 302 is etched (e.g., selectively etched), thereby exposing a surface 330 as well as a cavity 332 extending within and/or along the substrate 202 and resulting from the etching process described above in connection with FIG. 3B. This etching process to remove and/or partially remove the resist layer 302 may be mechanical, chemical and/or photochemical.

Figure 3D:
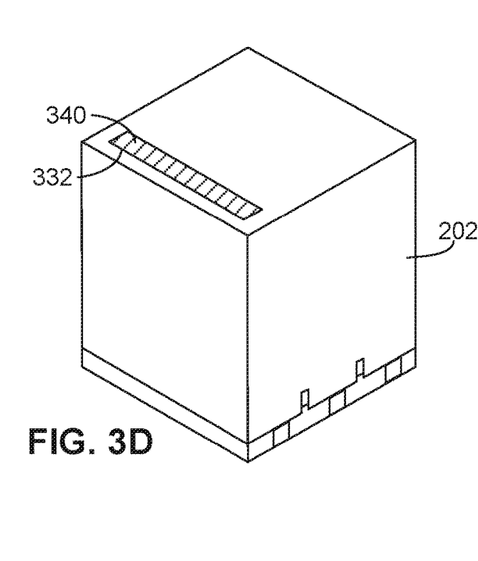

According to the illustrated example of FIG. 3D, a gettering material 340 is applied (e.g., provided, deposited) to the aforementioned cavity 332 of the example layered structure 200. In particular, the gettering material 340 of the illustrated example is applied via a filling process. However, any appropriate application and/or deposition process may be used. In particular, the gettering material 340 may be applied in a chemical vapor deposition (CVD) process, physical vapor deposition (PVD) process, plasma-enhanced chemical vapor deposition (PECVD) process and/or molecular beam epitaxy (MBE) process. The gettering material 340 may include, but is not limited to, silicate glass, Boron-Phosporous Silicate Glass, a semiconductor such as silicon or Germanium doped with Phosphorus, or any other appropriate gettering compound and/or material that attracts/draws impurities (e.g., metallic impurities resulting from a metallization process, etc.). The gettering material 340 may be applied at regular spatial intervals across the wafer 100.

While the gettering material 340 of the illustrated example is shown applied to the cavity 332, the gettering material 340 may be deposited/patterned onto a device, protrusion and/or a surface (e.g., a relatively flat surface), etc.

Figure 3E:
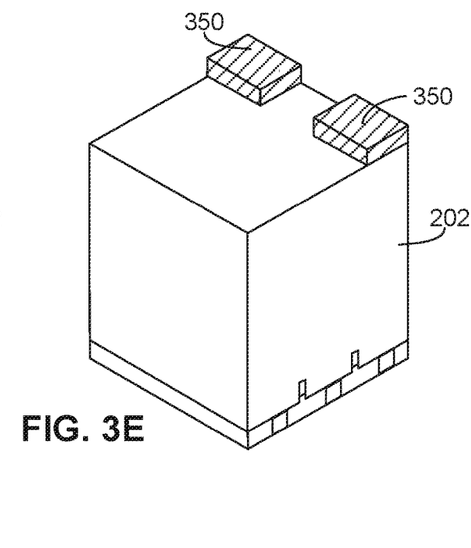

FIG. 3E illustrates an alternative example in which a pattern of gettering material 350 is defined in the example layered structure 200. The example pattern of gettering material 350 may be defined by etching and/or partially etching gettering material (e.g., by removing portions of the gettering material 340 that were previously applied/deposited). Additionally or alternatively, in some examples, the pattern of gettering material 350 is defined by a controlled deposition of gettering material. In other words, patterned deposition of the gettering material 350 defines a pattern of openings in the gettering material 340. In particular, the gettering material 340 may be applied in a patterned deposition process such as a lithography process. As can be seen in the examples of FIGS. 3D and 3E, gettering material 340 can extend from the substrate 202 and/or be embedded within the substrate 202.

Figure 4:
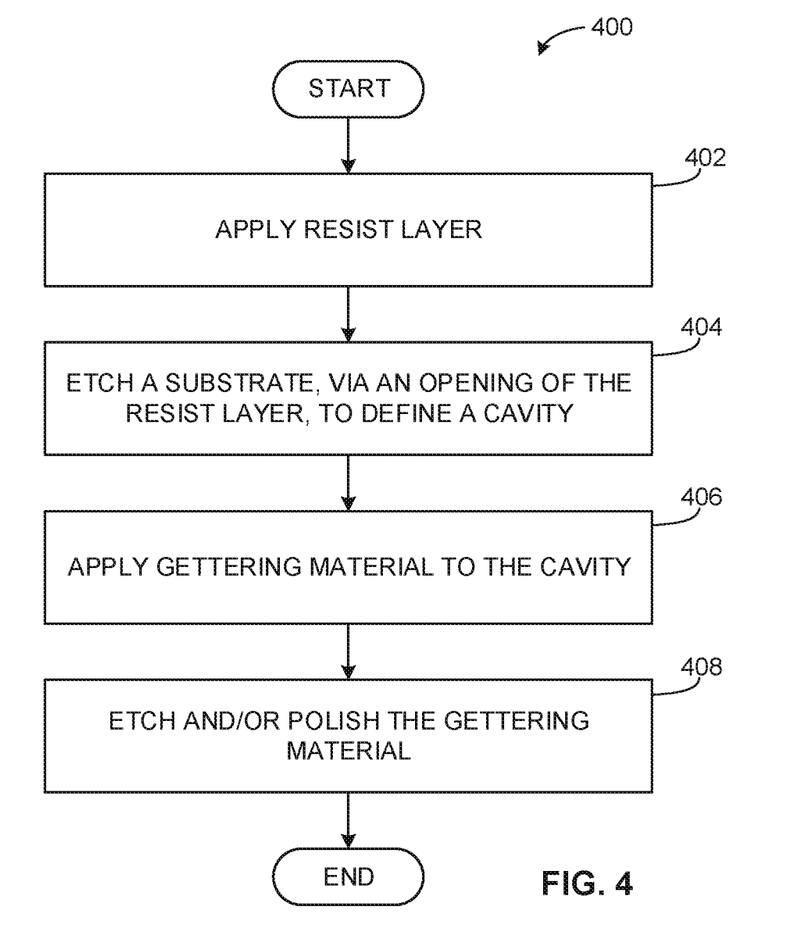
FIG. 4 is a flowchart representative of the example method represented in FIGS. 3A-3D.

FIG. 4 is a flowchart 400 representative of the example method described above in connection with FIGS. 3A-3D. The example method begins as a wafer such as the wafer 100 is being manufactured. In particular, the wafer of the illustrated example is to have metal interconnects defined within (e.g., to electrically couple transistors, etc.). To avoid potential shorting, a gettering material is to be applied to at least one dielectric layer of the wafer.

According to the illustrated example, a resist layer, such as a photo-resist and/or an etch-resist material, is applied (e.g., deposited) onto a substrate (e.g., the substrate 202) of the wafer (block 402). In particular, the example resist layer is to be applied to a back side of the wafer. In this example, the resist layer is patterned onto the substrate (e.g., applied and removed from portions of a surface of the substrate) such that openings (e.g., patterns of openings) in the resist layer are defined.

Next, a portion (e.g., a volume and/or a surface) of the substrate that is exposed by an opening of the resist layer is etched to define a cavity (e.g., an etched cavity) (block 404). The etching process may be mechanical, photochemical and/or chemical. In some examples, the etching may be performed in a multistage operation.

In this example, a gettering material is patterned and/or placed onto and/or within the cavity (block 406). For example, the gettering material may be selectively deposited/placed to one or more cavities and/or exposed surfaces (e.g., exposed openings in the resist layer) of a substrate material. Alternatively, the gettering material may be patterned onto the substrate without a resist layer (e.g., the gettering material is applied directly onto the substrate and not through openings defined by a resist) via a lithography process, for example.

In some examples, at least a portion of the gettering material is etched and/or polished (block 408) and the process ends.

FIGS. 5A-5D are cross-sectional views illustrating another alternative example method in accordance with the teachings of this disclosure. In particular, this example method utilizes a damage region defined in a substrate to attract impurities and/or processing byproducts such as free metal resulting from a back side reveal process, for example.

Figures 5A, 5B, 5C, 5D:
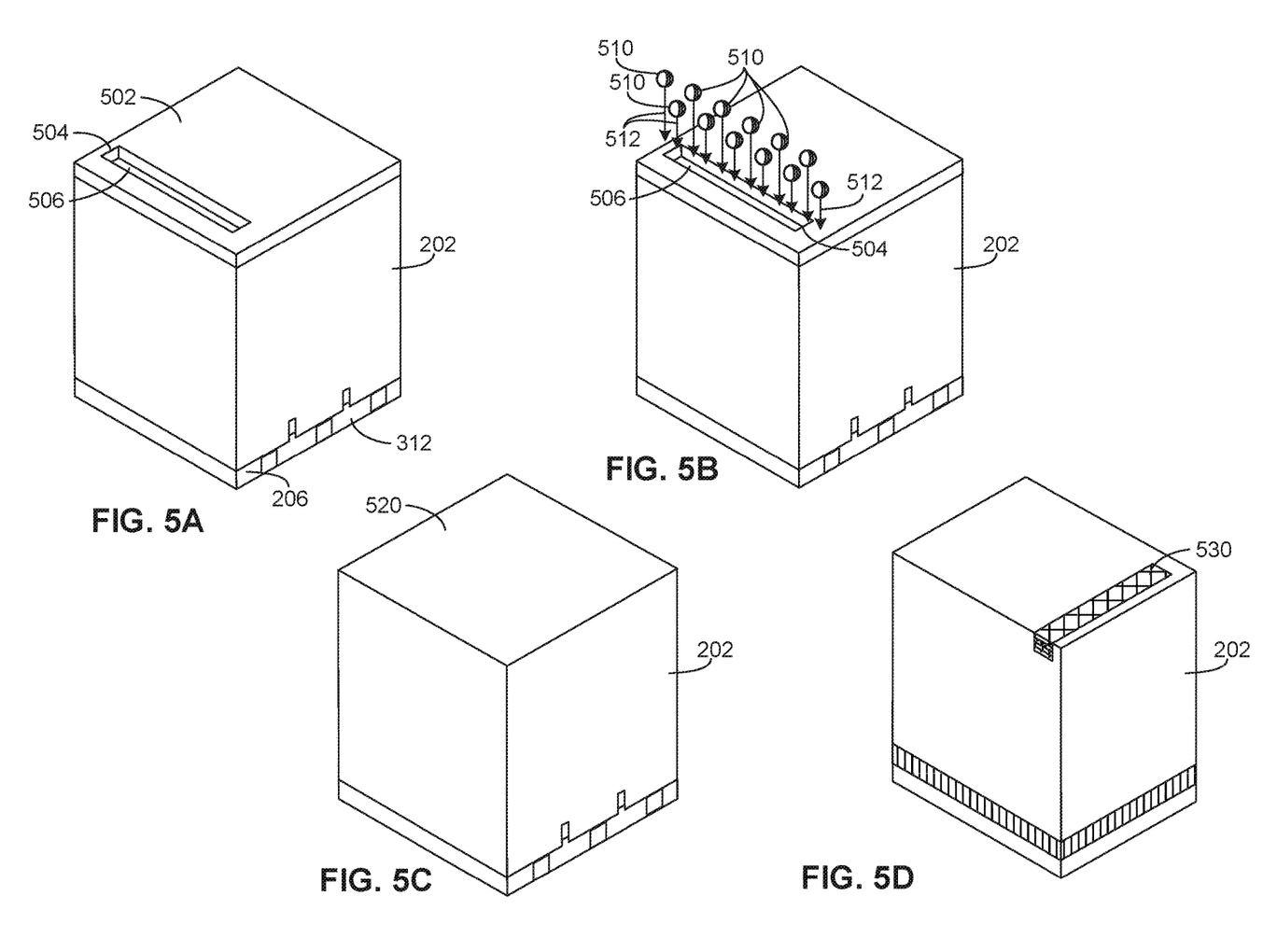
FIGS. 5A-5D are cross-sectional views of the example layered structure of FIG. 2, illustrating another alternative example method in accordance with the teachings of this disclosure.

Turning to FIG. 5A, the example layered structure 200 is shown with an applied resist layer (e.g., an implant resist layer) 502. In particular, the resist layer 502 of the illustrated example is applied to a back side surface of the substrate 202 on an opposite side from the component layer 206. In this example, the resist layer 502 defines an opening 504 that exposes a portion (e.g., a surface, an exposed surface) 506 of the substrate 202 at a back side of the wafer 100. In some examples, the opening 504 is defined via a lithography process used to apply the resist layer 502. In this example, the resist layer 502 includes multiple openings 504 at appropriate intervals to induce damage at multiple parts of the substrate 202.

The resist layer 502 may consist of Polymethyl Methacrylate (PMMA), AZ 111 photoresist, or any appropriate resist layer patterned to include a hard mask such as a Nitride layer (e.g., Carbon Nitride) to resist the ion implantation process described below in connection with FIG. 5B. The resist layer 502 of the illustrated example is applied at a thickness between 10 nm (nanometers) to 100 nm.

FIG. 5B depicts an ion implantation of the substrate 202 on a backside of the wafer. According to the illustrated example, ion particles (e.g., ionized particles) 510 are directed in a direction generally indicated by arrows 512 towards the exposed portion 506 of the substrate 202 via the opening 504. In this example, the ions particles 510 bombarding the exposed portion damage the exposed portion, thereby defining a damage region and/or area with a lattice disorder. In this example, the ionized particles 510 are accelerated towards the portion 506 via a beam source. The implanted ions may include, but are not limited to, Argon, Xenon, Neon, a column IV species such as Silicon or Germanium, Carbon, Fluorine or any appropriate element and/or compound. Any of these materials and/or combination of these materials and the damage that their ion implantation introduces to the substrate may function as an attractant for metal impurities, for example.

To define the aforementioned damage region, ions are implanted during the example process to cause molecular structures such as lattices of the substrate to be exposed, thereby defining bonding surfaces/volumes that attract metal impurities, for example. The degree to which the damage region (e.g., a damage region depth) is defined may be varied based on ion dosage, implantation energy, substrate temperature during ion implantation, beam current and/or any other appropriate ion implantation settings. Additionally or alternatively, high Phosphorous doping is applied to the substrate 202 (e.g. Phosphorous doping in Silicon/SiGe/Germanium) to at least partially define a damage region, for example.

Turning to FIG. 5C, an additional processing step that may be used in some examples is shown. According to the illustrated example, the resist layer 502 has been polished and/or etched, thereby exposing a top surface 520 of the substrate 202. Additionally or alternatively, the resist layer 502 is removed by any other appropriate mechanical, electrical or chemical processes. In some examples, the substrate 202 is also reduced in thickness in addition to the resist layer 502 when the resist layer is being removed and/or at least partially removed.

FIG. 5D is a cross-sectional view highlighting a distribution of damage of the multilayered die construction 200. As can be seen in the illustrated view of FIG. 5D, which is rotated from views 5A-5C to illustrate a region volume/volume 530, significant damage is seen in the region/volume 530 after being bombarded by ions, primarily in the exposed portion of the substrate 202. The view of FIG. 5C also indicates a chemical concentration gradient of impurities attracted to the damage region.

Figure 6:
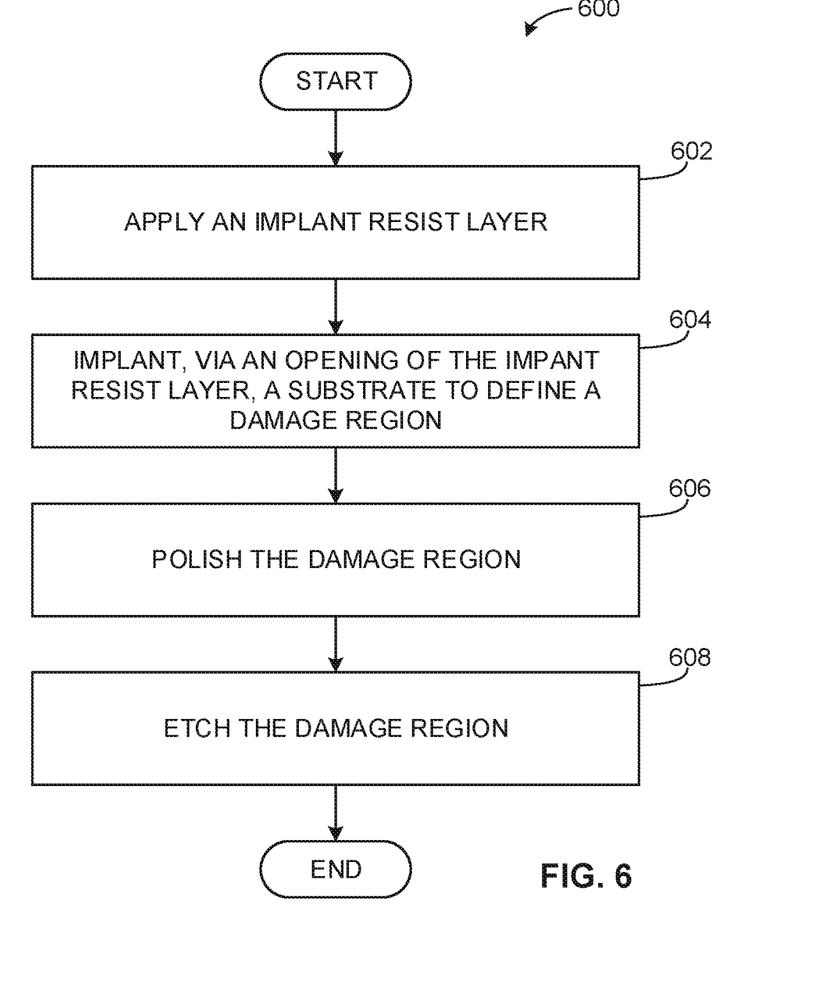
FIG. 6 is a flowchart representative of the example method represented in FIGS. 5A-5D.

FIG. 6 is a flowchart 600 representative of the example method described above in connection with FIGS. 5A-5D. The example method begins as a wafer such as the wafer 100 is being processed so that dies can be cut from the wafer. In this example, the wafer is being processed so that components and/or interconnects can be defined within the wafer while preventing and/or reducing potential shorts resulting from metal impurities.

According to the illustrated example, a resist layer (e.g., an implant stop/resist layer) is applied (e.g., deposited) and/or patterned onto a substrate (e.g., the substrate 202) of the wafer (block 602). In particular, the resist layer is to be applied to a back side of the wafer. In this example, the resist layer is patterned onto the substrate (e.g., applied at portions of a surface of the substrate). The resist layer of the illustrated example defines an opening.

Next, a portion of the substrate that is exposed by an opening of the resist layer is implanted with ions via an implantation process to define a damage region (e.g., a damage portion, a damage volume, etc.) (block 604). Alternatively, in some examples, a resist layer is not utilized, and the substrate and/or portions of the substrate are exposed to the implantation process. For example, the implantation is applied to a confined area of the substrate (e.g., implanted via a confined/narrow ion beam).

In some examples, the damage region is polished (block 606). For example, at least a portion of the damage region may be polished to reveal portions of the substrate.

Additionally or alternatively, in some examples, the damage region is etched (block 608) and the process ends. In some examples, the substrate is also etched and/or thinned when the damage region is reduced and/or removed. The example damage region may be etched via a mechanical, photochemical and/or chemical process.

As described above, flowcharts representative of example methods for implementing the examples disclosed herein are shown in FIGS. 4 and 6. The example methods may be implemented by machine readable instructions that comprise a program(s) for execution by a processor such as the processor 712 shown in the example processor platform 700 discussed below in connection with FIG. 7. The program, which may be implemented by semiconductor fabrication equipment, may be embodied in software stored on a tangible computer readable storage medium such as a CD-ROM, a floppy disk, a hard drive, a digital versatile disk (DVD), a Blu-ray disk, or a memory associated with the processor 712, but the entire program and/or parts thereof could alternatively be executed by a device other than the processor 712 and/or embodied in firmware or dedicated hardware. Further, although the example program is described with reference to the flowcharts illustrated in FIGS. 4 and 6, many other methods of implementing the examples disclosed herein may alternatively be used. For example, the order of execution of the blocks may be changed, and/or some of the blocks described may be changed, eliminated, or combined.

As mentioned above, the example methods of FIGS. 4 and 6 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example methods of FIGS. 4 and 6 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

Figure 7:
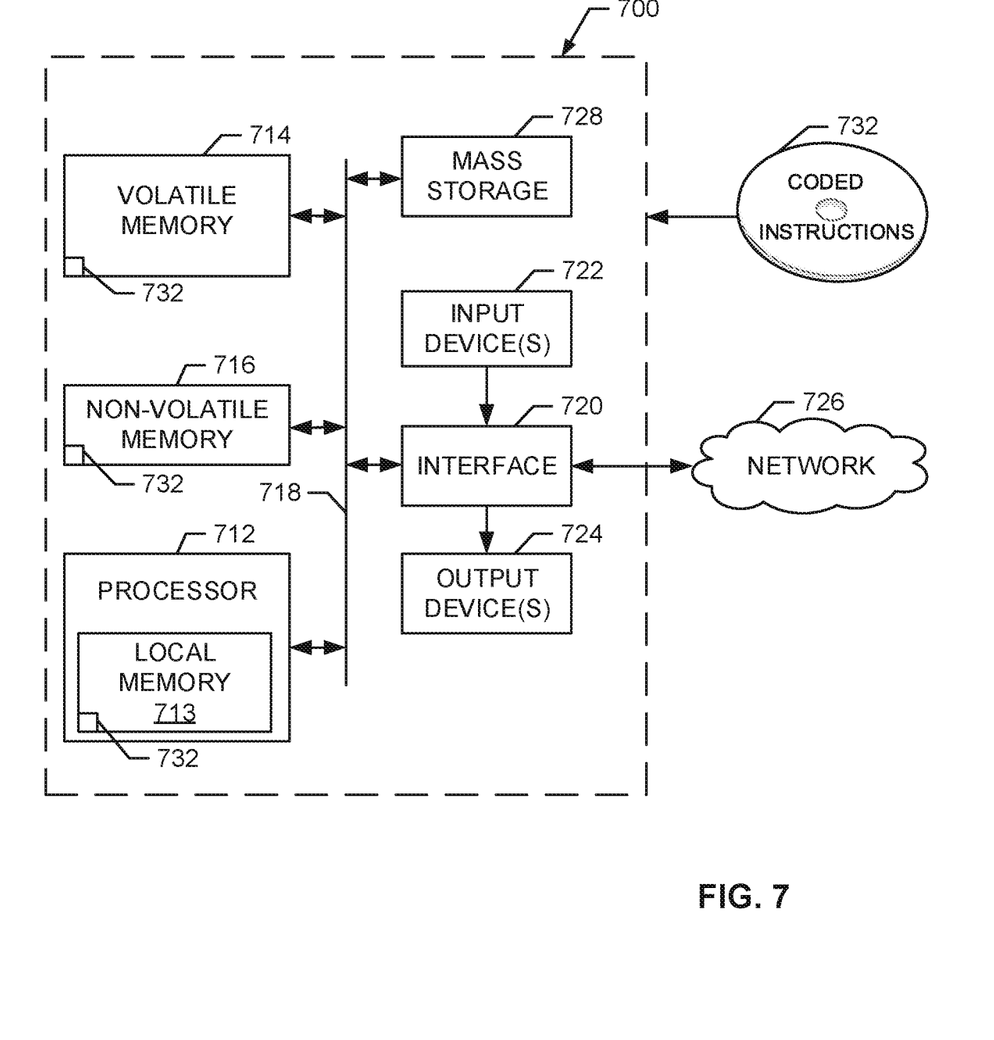
FIG. 7 is a processor platform that may be used to execute the example methods of FIGS. 4 and 6.

FIG. 7 is a block diagram of an example processor platform 700 capable of executing the instructions of FIGS. 4 and 6 to implement the examples disclosed herein. The processor platform 700 can be, for example, a semiconductor fabrication device, a wafer/die production controller, a wafer producing/processing device, a die/wafer etching device, a server, a personal computer, a mobile device (e.g., a cell phone, a smart phone, a tablet such as an iPad™), a personal digital assistant (PDA), an Internet appliance, a set top box, or any other type of computing device.

The processor platform 700 of the illustrated example includes a processor 712. The processor 712 of the illustrated example is hardware. For example, the processor 712 can be implemented by one or more integrated circuits, logic circuits, microprocessors or controllers from any desired family or manufacturer.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 716 may be implemented by flash memory and/or any other desired type of memory device. Access to the main memory 714, 716 is controlled by a memory controller.

The processor platform 700 of the illustrated example also includes an interface circuit 720. The interface circuit 720 may be implemented by any type of interface standard, such as an Ethernet interface, a universal serial bus (USB), and/or a PCI express interface.

In the illustrated example, one or more input devices 722 are connected to the interface circuit 720. The input device(s) 722 permit(s) a user to enter data and commands into the processor 712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 720 of the illustrated example, thus, typically includes a graphics driver card, a graphics driver chip or a graphics driver processor.

The interface circuit 720 of the illustrated example also includes a communication device such as a transmitter, a receiver, a transceiver, a modem and/or network interface card to facilitate exchange of data with external machines (e.g., computing devices of any kind) via a network 726 (e.g., an Ethernet connection, a digital subscriber line (DSL), a telephone line, coaxial cable, a cellular telephone system, etc.).

The processor platform 700 of the illustrated example also includes one or more mass storage devices 728 for storing software and/or data. Examples of such mass storage devices 728 include floppy disk drives, hard drive disks, compact disk drives, Blu-ray disk drives, RAID systems, and digital versatile disk (DVD) drives.

The coded instructions 732 of FIGS. 4 and 6 may be stored in the mass storage device 728, in the volatile memory 714, in the non-volatile memory 716, and/or on a removable tangible computer readable storage medium such as a CD or DVD.

Example 1 includes a multilayered die including a substrate material, a component layer below the substrate material, and an impurity attractant region disposed in the substrate material.

Example 2 includes the subject matter of Example 1, and further includes a resist layer above the substrate layer.

Example 3 includes the subject matter of any one of Examples 1 or 2, where the impurity attractant region includes gettering material.

Example 4 includes the subject matter of Example 3, where the gettering material includes silicate glass.

Example 5 includes the subject matter of Example 4, where the silicate glass is Boron-Phosphorous doped.

Example 6 includes the subject matter of any one of Examples 1 or 2, where the impurity attractant region includes a damage region.

Example 7 includes the subject matter of Example 6, where the damage region is defined via an ion implantation process.

Example 8 includes the subject matter of Example 7, where the damage region is defined via an application of doped Phosphorous.

Example 9 includes a processor including a plurality of transistors, a first substrate layer, a second substrate layer below the first substrate layer, and an impurity attractant region in at least one of the first substrate layer or the second substrate layer.

Example 10 includes the subject matter of Example 9, and further includes a resist layer.

Example 11 includes the subject matter of any one of Examples 9 or 10, where the impurity attractant region includes gettering material.

Example 12 includes the subject matter of Example 11, where the gettering material includes silicate glass.

Example 13 includes the subject matter of Example 12, where the silicate glass is Boron-Phosphorous doped.

Example 14 includes the subject matter of any one of Examples 9 or 10, where the impurity attract region includes a damage region.

Example 15 includes the subject matter of Example 14, where the damage region is defined via an ion implantation process.

Example 16 includes the subject matter of Example 14, where the damage region is defined via an application of doped Phosphorous.

Example 17 includes a method of fabricating a semiconductor die including applying a gettering material onto a substrate of the die.

Example 18 includes the subject matter of Example 17, and further includes applying a resist layer onto the substrate, and etching the substrate via an opening of the resist layer to define an etched surface of the substrate, where the gettering material is applied to the etched surface.

Example 19 includes the subject matter of any one of Examples 17 or 18, and further includes at least one of polishing or etching the gettering material.

Example 20 includes the subject matter of any one of Examples 17-19, and further includes defining interconnects disposed on or within the substrate.

Example 21 includes the subject matter of any one of Examples 17-20, where the gettering material includes silicate glass.

Example 22 includes the subject matter of Example 21, where the silicate glass is Boron-Phosphorous doped.

Example 23 includes the subject matter of any one of Examples 17-22, where applying the gettering material includes patterning the gettering material via a lithographic process.

Example 24 includes a method of fabricating a semiconductor die including implanting a substrate of the die to define a damage region of the substrate.

Example 25 includes the subject matter of Example 24, and further includes applying a resist layer onto a substrate of a die, where implanting the substrate occurs via an opening of the resist layer.

Example 26 includes the subject matter of any one of Examples 24 or 25, and further includes at least one of polishing or etching the resist layer.

Example 27 includes the subject matter of any one of Examples 24-26, and further includes at least one of polishing or etching the damage region.

Example 28 includes the subject matter of any one of Examples 24-27, where implanting the substrate includes an ion deposition process.

Example 29 includes the subject matter of any one of Examples 24-27, where implanting the substrate occurs via application of a doped Phosphorous.

From the foregoing, it will be appreciated that the above disclosed methods, apparatus and articles of manufacture enable a reduction in damage from impurities such as free metals that, in turn, can cause lower overall yields of semiconductor devices. The examples disclosed herein may also improve reliability of the semiconductor devices by reducing and/or eliminating impurities that can result in potential latent failures (e.g., failures of semiconductor devices that may not manifest until after dies are removed from a wafer).

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. Although the examples disclosed herein have been shown in examples related to semiconductors and/or microprocessors, the examples disclosed herein may be applied to any other appropriate interconnect (e.g., a layered interconnect) application(s) or etching processes in general.

What is claimed is:

1. A method of fabricating a semiconductor die comprising:
   etching, via an opening of a resist layer, a substrate to define an etched surface of the substrate; and
   applying a gettering material onto the etched surface of the substrate, wherein the gettering material comprises silicate glass doped with boron and phosphorus.

2. The method of claim 1, further comprising at least one of polishing or etching the gettering material.

3. The method of claim 2, wherein, after the polishing or etching, a surface of the gettering material is substantially planar with a surface of the substrate.

4. The method of claim 1, further comprising disposing interconnects on or within the substrate.

5. The method of claim 1, wherein a surface of the gettering material extends above a surface of the substrate.

6. A method of fabricating a semiconductor die comprising:

applying a resist layer onto a substrate of a die; and implanting the substrate of the die to define a damage region of the substrate via an opening of the resist layer; and polishing or etching the damage region.

7. The method as defined in claim 6, wherein said implanting the substrate comprises implanting at least one of argon, xenon, neon, germanium, carbon, or fluorine.

8. The method as defined in claim 7, wherein the substrate comprises silicon.

9. The method as defined in claim 6, further comprising disposing interconnects on or within the substrate.

10. The method as defined claim 6, wherein said implanting the substrate comprises implanting phosphorus.

11. A multilayered die comprising:

a substrate material;

a component layer below a first side of the substrate material; and a patterned gettering material on a second side of the substrate material opposite the first side, wherein the patterned gettering material comprises silicate glass doped with boron and phosphorus.

12. The multilayered die of claim 11, wherein the patterned gettering material is embedded within a cavity of the second side of the substrate material.

13. The multilayered die of claim 12, wherein a surface of the patterned gettering material is substantially planar with a surface of the second side of the substrate material.

14. The multilayered die of claim 11, wherein a surface of the patterned gettering material extends above a surface of the second side of the substrate material.

15. The multilayered die of claim 11, further comprising interconnects on or within the substrate material.

* * * * *